United States Patent [19]

Driscoll

[11] 3,868,606

[45] Feb. 25, 1975

[54] Q-MULTIPLIED CRYSTAL RESONATOR FOR IMPROVED HF AND VHF SOURCE STABILIZATION

[75] Inventor: Michael M. Driscoll, Baltimore, Md.

[73] Assignee: Westinghouse Electric Corporation, Pittsburgh, Pa.

[22] Filed: Sept. 28, 1973

[21] Appl. No.: 401,780

[52] U.S. Cl. .................. 333/80 T, 331/175, 333/72, 333/76

[51] Int. Cl. .......................... H03h 11/00, H03b 3/04

[58] Field of Search ............ 333/80 R, 80 T, 72, 76; 328/167; 331/18, 29, 115, 116 R, 132–134, 154, 155, 158–160, 175; 330/174; 332/26

[56] References Cited

UNITED STATES PATENTS

| | | | |
|---|---|---|---|
| 2,551,809 | 5/1951 | Mortley | 332/26 X |
| 2,600,124 | 6/1952 | Mortley | 333/80 X |
| 2,613,320 | 10/1952 | Panetta | 333/72 X |
| 2,675,432 | 4/1954 | Wen Yuan Pan | 333/72 X |
| 2,683,810 | 7/1954 | Mortley | 333/72 X |
| 3,056,890 | 10/1962 | Stoops et al. | 333/76 X |
| 3,693,105 | 9/1972 | Kleinberg | 331/115 X |

OTHER PUBLICATIONS

"Reference Data for Radioengineer,"Howard Sams & Co., Inc. New York 1968; page 17–19.

*Primary Examiner*—James W. Lawrence
*Assistant Examiner*—Marvin Nussbaum
*Attorney, Agent, or Firm*—R. M. Trepp

[57] ABSTRACT

A Q-multiplied crystal resonator is used for improved HF and VHF source stabilization utilizing a low noise controlled negative resistance generator and amplifier in combination with a crystal unit to achieve effective multiplication of the unloaded crystal Q by factors of three and more. By loading the crystal unit with the negative resistance generator a higher Q is achieved thereby improving frequency selectivity of the network. The combination of cascode connected amplifier stage, crystal, and negative resistance generator, when incorporated in the frequency discriminator portion of an AFC signal generator, provide a spectrally pure and low noise output.

6 Claims, 13 Drawing Figures

Q-MULTIPLIED CRYSTAL RESONATOR FOR IMPROVED HF AND VHF SOURCE STABILIZATION

CROSS-REFERENCE TO RELATED APPLICATION

Reference is made to the commonly assigned U.S. Pat. No. 3,836,873 issued Sept. 17, 1974, entitled "LOW NOISE VHF CRYSTAL CONTROLLED HARMONIC OSCILLATOR" of Daniel J. Healey III and Michael M. Driscoll.

BACKGROUND OF THE INVENTION

1. Field of the Invention

This invention relates to improved HF and VHF RF source stabilization and specifically to utilization of a Q-multiplied crystal resonator to achieve much improved spectral purity and low noise output.

2. State of the Prior Art

To achieve high performance in various radar and communication systems utilizing high performance HF and VHF signal sources it is necessary to have good short-term frequency stability. For instance in a coherent pulse doppler radar set (coherent MTI) the radar sensitivity in practice is limited by receiver noise that exists in the absence of received signals. Such systems are essentially single sideband transmitting and receiving apparatus in which received signals which occur simultaneously in time are distinguished and separated by the frequency difference of the signals. The capability of separating a desired small signal from an undesired larger signal by such means is dependent on the FM and PM (short-term frequency stability) exhibited by the radar transmitter and the beating signal generators employed to down convert the received signals to frequencies at which the requisite frequency selective filtering becomes practical.

Continuing with the example of a coherent pulse doppler radar set as exemplary of the type of HF and VHF systems requiring short-term frequency stability signal sources, the carrier frequency generator employed for the transmitter exciter and the beating signal generator for providing the first frequency changing operation in the receiver are extremely important to the performance of such radar sets. In systems having well designed amplifiers and auxiliary circuits for the transmitter, and a well designed receiver that exhibit adequate cross modulation and inner modulation characteristics, the performance characteristics of such frequency generators will determine the radar detection performance in the presence of large natural signal interference resulting from ground, sea, and cloud echoes.

In the coherent pulse doppler radar set as well as other communication systems, it is extremely desirable to provide a source of extremely low noise microwave frequency signal. A significant measure of the noise content of an RF signal is the frequency domain measure of phase fluctuations (noise, instability, modulation, as provided by the parameter $L(f)$. $L(f)$ is defined as the ratio of the power in one phase noise sideband, referred to the input carrier frequency, on a per hertz of bandwidth spectral density basis, to the total signal power, at Fourier frequency $f$ from the signal's average or norminal frequency $f_o$. The parameter $L(f)$ typically is expressed in units of dB/Hz.

The concept of AFC stabilization of a klystron oscillator by means of a microwave frequency discriminator employing a resonant microwave cavity as a passive frequency reference is old. A cavity-stabilized klystron stalo utilizing this technique is discussed in "Radar Handbook," by M. I. Skolnik, McGraw Hill Book Company, 1970, pages 5–13.

The same technique using an AFC loop for frequency stabilization of VHF L-C voltage controlled oscillators (VCO) has been used as shown in FIG. 1. phase perturbations in the VHF oscillator are detected by the VHF frequency discriminator employing single pole VHF crystal bandpass filters (s) then converted to a voltage output and fedback to the VCO control input to stabilize the oscillator output frequency.

However, in attempting to apply the AFC loop frequency stabilization techniques to a VHF voltage controlled crystal oscillator (VCXO) as shown in FIG. 2, significant limitations are noted. Computation and measurement of the performance obtainable with the use of the circuit of FIG. 2 shows that output signal spectral purity is not improved over that achievable with current state of the art quartz crystal oscillators. The frequency discriminator sensitivity is limited in that the maximum group delay of the crystal filter is only a fraction of that for the unloaded crystal unit and additionally the crystal filter drive level is limited to several milliwatts or less for stable operation. As a result phase (product) detector and amplifier self-noise limit the system sensitivity and performance.

As discussed above, one indication of the noise content of an RF signal is the power spectral density $L(f)$ of that signal. The power spectral density of the AFC signal generator circuit of FIG. 2 is degraded because of the above noted limitations. To overcome these limitations it is necessary to devise circuitry of such form that the ratio of phase detector drive to crystal unit dissipation can be increased and the resonator group delay (proportional to Q) can be increased in order to achieve higher frequency discriminator sensitivity while maintaining stable operation.

SUMMARY OF THE INVENTION

The subject invention is directed to a highly stable HF and VHF source utilizing a Q-multiplied quartz crystal resonator and comprises a stable high gain, high isolation cascode connected amplifier section having an RF signal input and output connected to a quartz crystal unit loaded by a negative resistance generator so as to effectively multiply the Q of the quartz crystal unit. The Q-multiplied quartz crystal resonator can be included in the frequency discriminator section of an AFC stabilization loop to provide an improved low-noise spectrally pure frequency source. The Q-multiplied quartz crystal resonator provides an extremely selective transmission response; large delay and power gain together with low resonator phase noise levels to give superior output signal spectral purity.

BRIEF DESCRIPTION OF THE DRAWINGS

The above and other objects and features of the subject invention will be better understood from the following detailed description of the invention taken in connection with the accompanying drawings in which.

DESCRIPTION OF THE PREFERRED EMBODIMENTS OF THIS INVENTION

Figure 1:
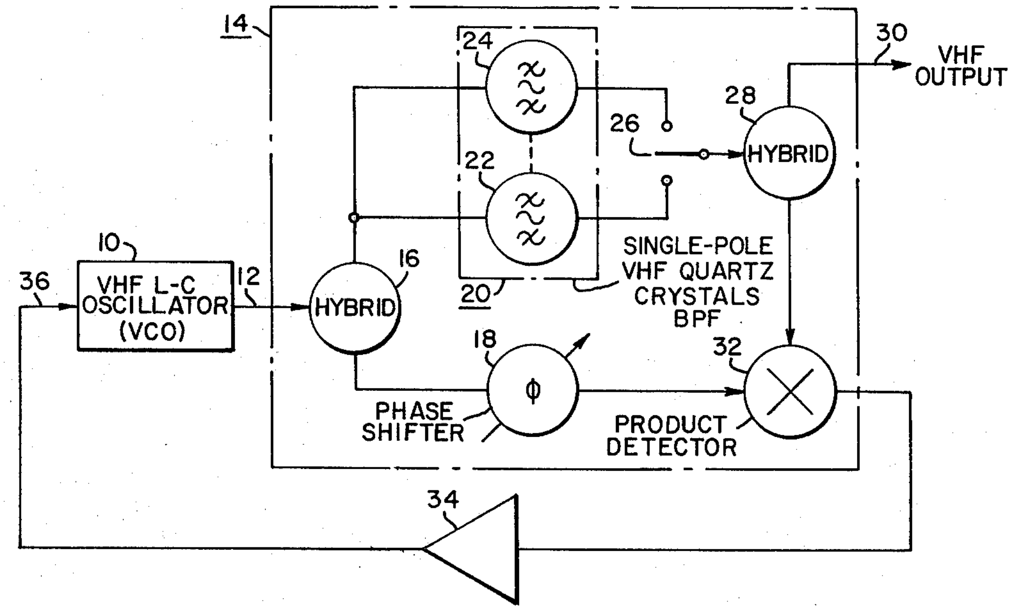
PRIOR ART FIG. 1
FIG. 1 shows schematically a prior art AFC stabilization technique for a VHF L-C voltage controlled oscillator.

In FIG. 1 a prior art AFC stabilization circuit for a VHF L-C voltage controlled oscillator is shown. The oscillator (VCO) 10 has an output 12 connected to the frequency discriminator section 14. Hybrid circuit 16 receives the signal from oscillator 10 and divides it between the circuit branch containing phase shifter 18 and the branch containing the passive single pole VHF quartz crystal bandpass filter bank 20. The filter 20 is comprised of a plurality of single pole VHF quartz crystal filters here represented by 22 and 24. Frequency selection is made by switch 26 which connects the desired crystal filter to hybrid circuit 28. Hybrid circuit 28 acting as a power divider splits the signal between VHF output 30 and product detector 32.

The phase shifter 18 which typically could be a λ delay line is also connected to product detector 32.

Frequency instabilities in the oscillator 10 are converted to phase fluctuations in filter 20 which are compared to the phase of the signal fed through phase shifter 18 in the product detector 32. The voltage output from the product detector 32 which is proportional to those relative phase fluctuations is amplified by operational amplifier 34 and fedback to the frequency controlled input 36 of the oscillator 10. In this manner the AFC stabilization loop connection is completed and the output signal frequency of the oscillator 10 is stabilized. The amplitude response of each crystal filter of filter bank 20 provides a non-zero pole in the frequency discriminator transfer function so that stable AFC operation is possible for AFC bandwidths several times larger than the bandwidth of the particular crystal filter used.

For the stabilization of microwave oscillators such as a klystron oscillator similar AFC loops have been used. If the VHF oscillator 10 of FIG. 1 is replaced with a microwave oscillator, then a microwave cavity filter would be substituted for the bandpass filter bank 20. This type of stabilization technique is shown in "Radar Handbook" by M. I. Skolnik, McGraw Book Company, 1970, pp. 5–13.

Figure 2:
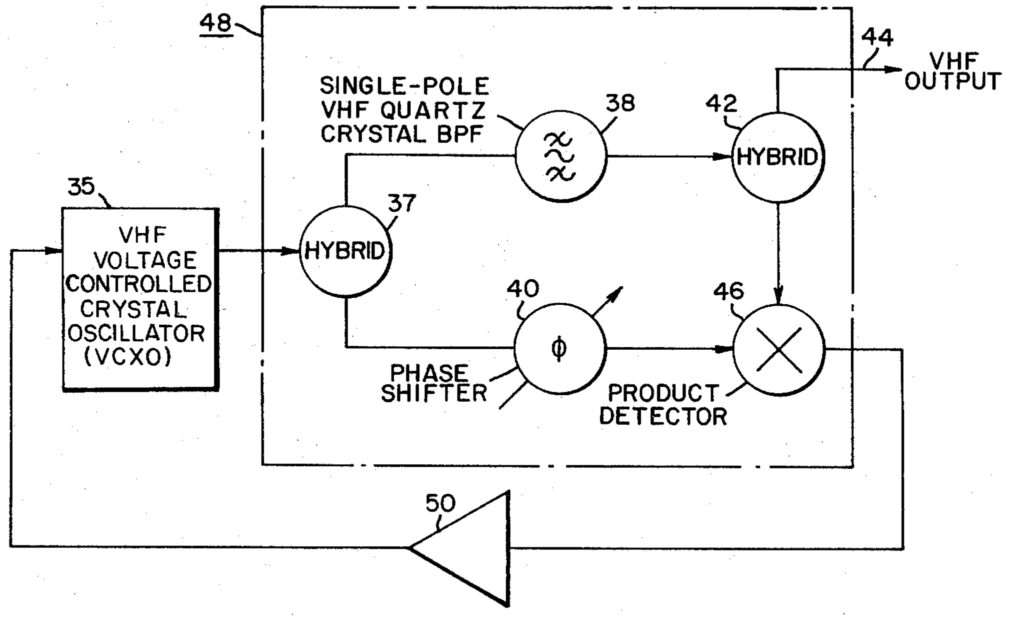
PRIOR ART FIG. 2
FIG. 2 shows schematically a prior art AFC stabilization technique for a VHF voltage controlled crystal oscillator (VCX0)

In FIG. 2 a prior art AFC stabilization circuit is shown for a VHF voltage controlled crystal oscillator (VCXO). The circuit of FIG. 2 is quite similar to that of FIG. 1 except for the substitution of the VHF voltage controlled crystal oscillator (VCXO) 35 for the oscillator (VCO) 10. The signal output of oscillator 35 is connected to hybrid circuit 37 for dividing the signal between the single pole VHF quartz crystal bandpass filter 38 and the phase shifter 40. The filter output of bandpass filter 38 is applied to hydrid circuit 42 which divides the signal between the VHF output 44 and the product detector 46. The voltage output of the product detector 46 is proportional to phase fluctuation detected by the frequency discriminator section 48 in the signal output of oscillator 36. The voltage is amplified by operational amplifier 50 and applied to the voltage control input of the crystal oscillator 35.

The operation of the stabilization circuit of FIG. 2 does not significantly improve the spectral purity of the oscillator output signal due to several limitations inherent in the crystal bandpass filter 38. The main limitations are that frequency discriminator 48 sensitivity is limited in that the maximum group delay of the crystal bandpass filter 38 is only a fraction of that for the unloaded crystal unit. Additionally, the crystal filter 38 drive is limited to only several milliwatts. As a result of these limitations, the product detector 46 and amplifier 50 selfnoise limit the system sensitivity in performance.

Figure 3:
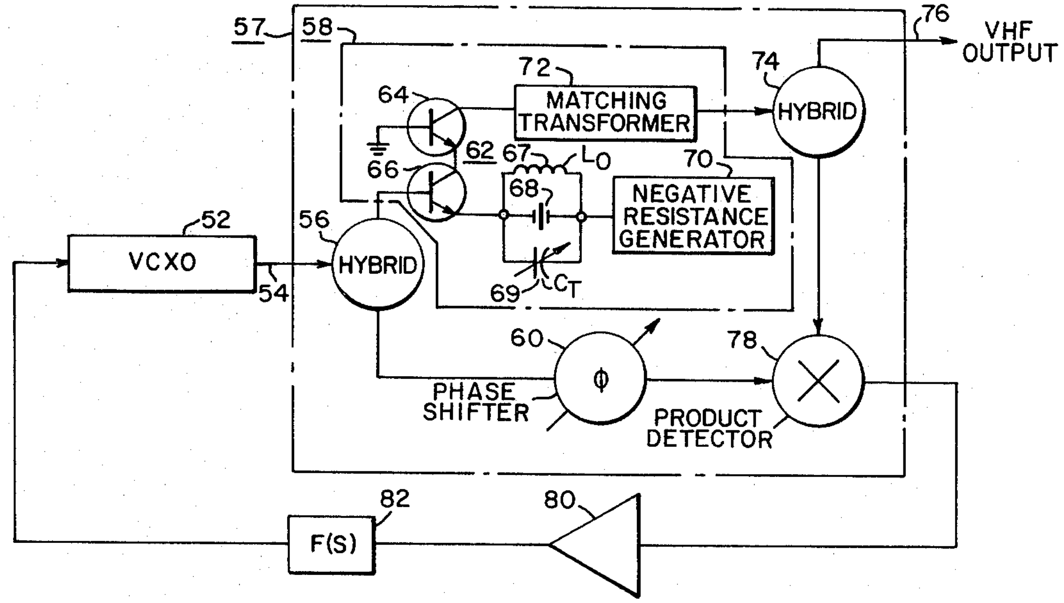
FIG. 3 shows schematically the circuit for improved HF and VHF source stabilization using the Q-multiplied crystal resonator of this invention.

These difficulties are overcome by the circuits shown in FIG. 3. A voltage controlled crystal oscillator (VCXO) 52 has a signal output 54 applied to the hybrid circuit 56 of the frequency discriminator section 57. The input signal is divided by the hybrid circuit 56 between the Q-multiplied crystal resonator 58 and the phase shifter 60. The Q-multiplied crystal resonator 58 includes a cascode amplifier 62 comprising serially connected common base transistor 64 and common emitter transistor 66, and a crystal unit 68 loaded by a negative resistance generator 70. A matching transformer 72 connects the output of the crystal resonator 58 to hybrid circuit 74 which splits the signal to the VHF output 76 and phase detector 78.

The static capacitance of crystal unit 68 is antiresonated by inductance 67 and capacitance 69, having values $L_0$ and $C_T$ respectively, connected in parallel with the crystal unit 68. The functioning of these elements is discussed in detail below in conjunction with FIGS. 4A and 4B.

Any frequency instabilities in the crystal oscillator 52 are converted to phase changes in the crystal resonator 58. The phase shifter 60 acts to pass the oscillator output with negligible distortion since it has a wide band characteristic. The crystal resonator 58, however effectively is able to detect very small frequency instabilities because of its narrow passband, high effective Q and hence high group delay characteristics. Phase detector 78 outputs a voltage proportional to the frequency instabilities of the crystal oscillator 52. This voltage output is amplified by amplifier 80, passed through loop filter 82 and applied to the voltage control input of the crystal oscillator 52.

The resonator 58 overcomes those problems identified with the crystal bandpass filter 38 used in the AFC stabilization circuit of FIG. 2. By using the negative resistance generator 70 the effective Q of the crystal unit 68 is multiplied several times over that of the unloaded crystal unit. The group delay of the crystal unit is of course thereby increased also. By using the cascode amplifier circuit 62 several additional advantages are obtained. A large ratio of output power to crystal dissipation is achieved, there is negligible loading of the crystal unit 68, and dominant transistor noise sources at Fourier frequencies in excess of the effective crystal half-bandwidth are suppressed due to the high out of band impedance of the crystal unit 68. A detailed discussion of the advantage of a cascode maintaining circuit for a crystal oscillator in which the crystal unit is utilized as the first stage external emitter impedance, is found in the article "Two Stage Self-Limiting Quartz Crystal Oscillator Exhibiting Improved Short-Term Frequency Stability," by M. M. Driscoll and found in the IEEE Proceedings of Instrumentation and Measurement, June 1973.

Because of the Q-multiplicative effect achieved with the negative resistance generator 70 and because a higher level drive is possible for the phase detector 78, the self-noise of the phase detector 78 and amplifier 80 are not limitations on the system sensitivity. The effective bandwidth of the crystal resonator is made narrower through the Q-multiplication. This allows suppression of the effect of the self-noise generated by the negative resistance generator 70 and the cascode connected amplifier 62 at relatively low modulation rates.

The limiting parameter at low modulation rates of the AFC stabilization loop shown in FIG. 3 is the efficiency of conversion of the Q-multiplied resonator phase noise to frequency discriminator frequency noise which is dependent on the resonator group delay. The same conversion of phase to frequency noise occurs in all crystal oscillators and therefore the improvement in output signal frequency stability at low modulation rates for the circuit of FIG. 3 is measured by the ratio of effective Q of the Q-multiplied crystal AFC service to the effective operating Q of the crystal in normal oscillator service. This is an accurate measurement of improved stability provided the phase noise of the Q-multiplied crystal resonator 58 is equal to that of the maintaining circuit of the crystal oscillator 52. Thus the greater the Q-multiplication, the greater will be the improvement in stability. At moderate modulation rates, i.e. just outside the bandwidth of the Q-multiplied resonator 58, improvement in spectral purity is also obtained due to the suppression of the oscillator 52 and resonator 58 selfnoise by means of the amplitude response of the resonator 58.

Selection of an optimum AFC loop bandwidth depends on the relative noise levels of the oscillator 52 with Q-multiplied resonator 58, the phase detector 78 and the DC amplifier 80. The overall bandwidth will vary depending on total system requirements. The loop filter 82 is therefore incorporated in the AFC loop to allow for varying the overall bandwidth. The filter 82 permits selection of the AFC bandwidth and DC gain substantially independent of the bandwidth of the Q-multiplied resonator 58.

Figure 4A:
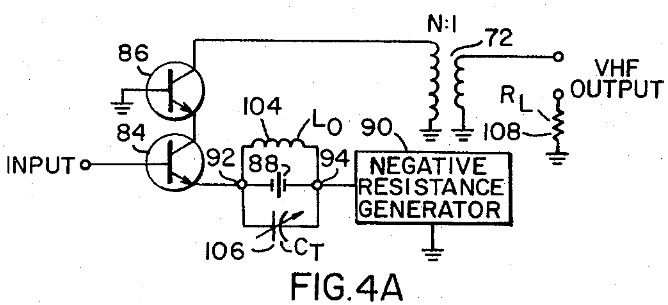
FIG. 4A shows the circuit of the Q-multiplied crystal resonator of this invention and FIG. 4B shows an equivalent circuit for the crystal unit of FIG. 4A.

In FIG. 4A the Q-multiplied crystal resonator 58 and the matching transformer 72 of FIG. 3 are shown in greater detail. The circuit of FIG. 4A operates as the active frequency reference in the AFC loop of FIG. 3. Transistors 84 and 86, each having a base, collector and emitter electrode, are connected serially as a cascode (i.e. a common emitter and common base configuration) amplifier. The RF signal input is received at the base of transistor 84 and the output is taken from the collector of transistor 86. The collector of transistor 84 is connected to the emitter of transistor 86. The base electrode of transistor 86 is held at signal ground potential and the emitter of transistor 84 is connected to signal ground through crystal unit 88 and negative resistance generator 90.

Figure 4B:
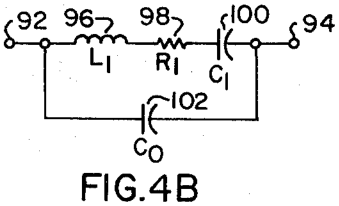

In FIG. 4A crystal unit 88 is connected between transistor 84 and negative resistance generator 90 at terminals 92 and 94 respectively. An equivalent circuit of the impedance of crystal 88 is shown in FIG. 4B and comprises a series RLC combination of the inductor 96, the resistor 98 and capacitor 100 connected in parallel with the capacitor 102, these elements having values of $L_1$, $R_1$, $C_1$ and $C_o$ respectively. The capacitance 102 represents the static capacitance of the crystal 88 and must be neutralized so that the crystal unit 88 impedance function will be symmetrical about the series resonant frequency thereby improving its frequency stability. In FIG. 4A the static capacitance 102 of the crystal unit 88 is precisely neutralized at the crystal unit series resonant frequency. This is accomplished by means of an inductor 104 having a value of $L_O$ placed in parallel connection with the crystal unit 88. Since the value of the static capacitance $C_0$ is comparatively small and changes from crystal unit to crystal unit and also because of typical manufacturing tolerances for the inductor 104, a variable trimmer capacitor 106 having a value $C_T$ is also coupled across the crystal unit 88. $L_0$ is chosen so that adjustment of trimmer capacitance $C_T$ results in exact neutralization of $C_0$ at the series resonant frequency of the crystal 88.

The negative resistance generator 90 may be considered as a crystal oscillator maintaining circuit with, however, slightly less positive feedback than that necessary for sustained oscillation at the crystal series resonant frequency when connected to the crystal unit 88 as shown. Viewing the negative resistance generator 90 in this manner, there are as many types of negative resistance generator networks suitable to provide Q-multiplication of the crystal unit 88 as there are suitable types of series mode, crystal oscillator maintaining circuits. Possible negative resistance generator networks which can be used for this purpose are discussed in detail below.

The matching transformer 72 is comprised of a primary and secondary coil having a turns ratio N:1. The transfer characteristic H(s) of the resonator 58 in combination with the transformer 72 is therefore defined by the equation:

$$H(s)=(N)(R_L)/Z_E(s) \quad (1)$$

where $R_L$ represents the value of the output load 108 and $Z_E(S)$ is the impedance facing the emitter of transistor 84.

Figure 5:
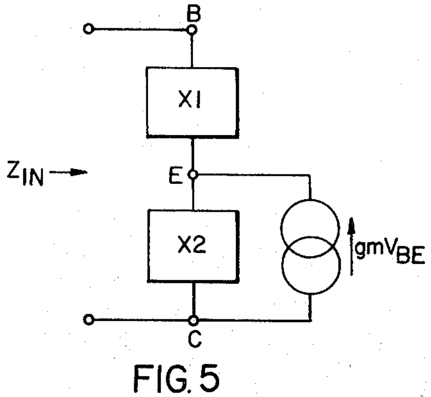
FIG. 5 shows a circuit for a representative negative resistance generator which can be used in this invention.
Figure 6:
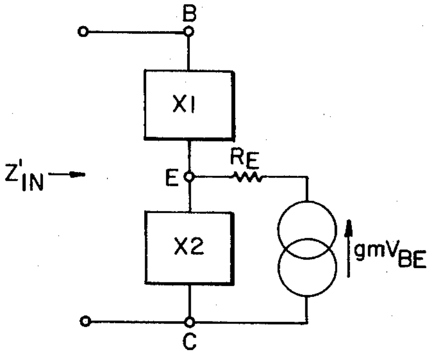
FIG. 6 shows a circuit diagram of another negative resistance generator which can be used in this invention.

In FIGS. 5, 6 and 7 there are shown the equivalent circuits for several negative resistance generators. The circuits of FIGS. 5 and 6 illustrate the stabilizing effect of local negative feedback in the transistor on the input impedance when used for instance in the negative resistance generator portion of a Pierce oscillator circuit. The base, emitter and collector terminals of the transistor in each circuit are indicated by B, E, and C respectively. The input impedance for the negative resistance generator circuit of FIG. 5 is given by the following equation:

$$Z_{IN} = jX1 + jX2 - gm\ (x1)\ (X2) \quad (2)$$

and the input impedance for the negative resistance generator circuit of FIG. 6 is given by the equation:

$$Z'_{IN} = jX1 + jX2 - (X1)\ (X2)/(1/gm + R_E) \quad (3)$$

It is clear that a negative resistance is generated in each case given by third term in equations (2) and (3) respectively. In the circuit of FIG. 5, the value of negative resistance is highly dependent upon the transconductance of the transistor. In the circuit of FIG. 6 however, the negative resistance term can be made extermely non-sensitive to transconductance by making $R_E$ much larger than the quantity 1/gm.

Although the negative resistance generator shown in FIG. 5 could have a Q-multiplying effect if properly connected to a crystal unit, it would be less than optimum in that the magnitude and phase of the negative resistance is largely dependent on transistor transconductance gm. The result is that the conversion of low frequency noise-like variations in transistor transconductance gm into signal amplitude and phase modulation in the Q-multiplied resonator would result in unacceptable performance.

Consequently, the negative resistance generator network which can give optimum results in the circuit of FIG. 4A should have a negative resistance portion if the input impedance which is largely a function of passive feedback elements rather than active element parameters of the transistor generator, as indicated in FIG. 6. It is desirable however especially with the use of high frequency high overtone crystal units that the input impedance of the negative resistance generator contain minimal value imaginary components which will have a frequency "pulling" effect on overall circuit resonance when connected in series with the crystal unit. Of course the negative resistance generator out-of-band impedance function must be such that spurious oscillation not occur at frequencies of other modes of vibration of the crystal unit. (This is a requirement in oscillator circuitry employing high overtone crystal units as well.)

Figure 7A:
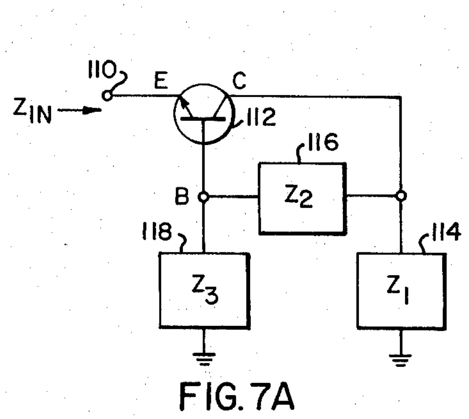
FIGS. 7A and 7B show respectively a circuit for the preferred negative resistance generator used in this invention and the transistor equivalent circuit therefor.
Figure 7B:
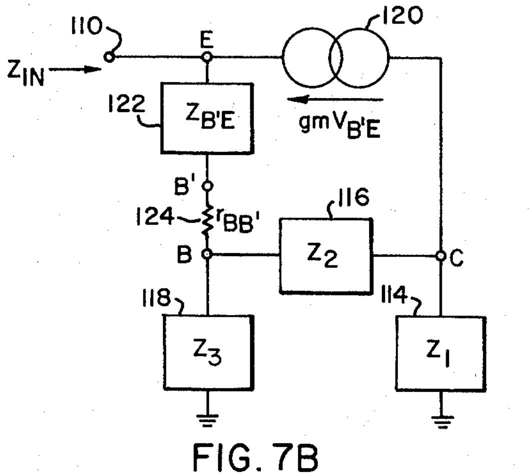

The negative resistance generator network shown in FIG. 7A with the transistor equivalent circuit of FIG. 7B presents an input negative resistance term with near zero imaginary component which is essentially a function of passive elements of the circuit and consequently provides optimum performance in the Q-multiplied crystal resonator circuit of FIG. 4A.

In FIG. 7A input terminal 110 is connected to the emitter of transistor 112. Impedances 114, 116 and 118 having values respectively of $Z_1$, $Z_2$ and $Z_3$ are connected in a $\pi$ configuration between the base and collector of transistor 112. This network is of the type used in both the Colpitts and Bridge-Tee type oscillators.

The transistor equivalent circuit of FIG. 7B has ideal current source 120 which produces a current of value $gmV_{B'E}$ in the direction indicated between the emitter and collector terminals which are indicated respectively by E and C. Between the emitter and base terminals, shown as terminals E and B, the transistor base emitter impedance 122 having a value $Z_{B'E}$ and the base spreading resistance 124 having the value $r_{BB'}$ are serially connected. The circuit impedances 114, 116 and 118 are connected in the $\pi$ configuration as in FIG. 7A between the base and collector terminals indicated by B and C respectively.

The input impedance $Z_{IN}$ for the negative resistance generator of FIG. 7A and 7B can be shown to be:

$$Z_{IN} = [r_{BB'} + Z_{B'E}/1 + gm\ (Z_{B'E})] + [(Z_2)(Z_3)/Z_T\ (1 + gm\ (Z_{B'E})] + [(Z_1)\ (Z_3)/Z_T] \quad (4)$$

where $r_{BB'}$ = base spreading resistance of transistor 112, gm = transconductance of transistor 112, $Z_{B'E}$ = the ratio of AC current gain of the transistor to the transductance (gm), and $Z_T = Z_1 + Z_2 + Z_3$. By proper choice of impedance terms $Z_1$, $Z_2$ and $Z_3$ the negative resistance is the third term in equation (4) and is completely dependent upon passive feedback components.

By proper selection of the values for the impedances $Z_1$, $Z_2$ and $Z_3$ instability at low frequency modes of vibration in the crystal unit can be prevented. Additionally as indicated in the expression above, if the frequency of operation is well below the cutoff frequency of the transistor 112, the negative term is much larger than either of the other two terms. Thus if $Z_1$ and $Z_3$ are imaginary impedances of like sign and $Z_T$ equals $R_S$ (series resistance of the resonant combination of $Z_1 + Z_2 + Z_3$), then the negative resistance term will be $(Z_1)(Z_3)/Z_T$.

Figure 8A:
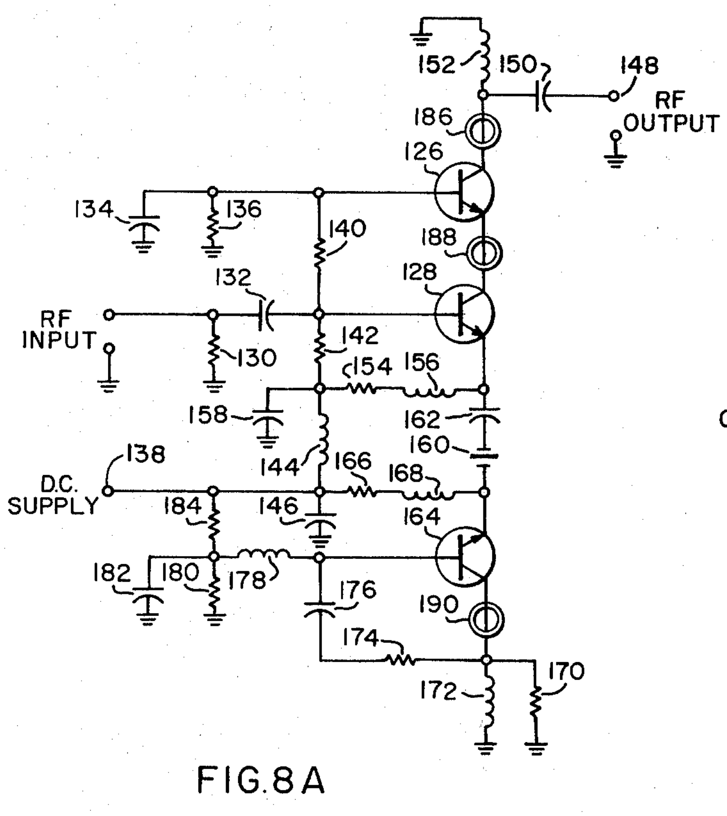
FIG. 8A is a detailed circuit diagram of the embodiment shown in FIG. 4 for a 30 MHz Q-multiplied crystal resonator and FIG. 8B shows an alternative means of connecting the crystal in the circuit of FIG. 8A.

In FIG. 8A there is shown a detailed schematic circuit diagram of the Q-multiplied crystal resonator of FIG. 4A. A series connected cascode amplifier comprising transistors 126 and 128 are coupled emitter to collector respectively. An RF input is provided across resistance 130 to the base of transistor 128 through the coupling capacitance 132. The common base connected transistor 126 has its base connected to ground through bypass capacitance 134 set in parallel with resistance 136. DC bias is supplied to the base of each transistor 126 and 128 from DC supply 138 through the dividing network comprised of resistances 140, 136, and 142 and the inductance 144. An RF bypass capacitor 146 is connected between the junction of battery supply 138 and inductance 144 and ground for decoupling. An RF output 148 is taken from the collector of transistor 126 through capacitance 150. Inductance 152 connected to the capacitance 150 and running to ground provides proper impedance matching for the RF ouput 148. Proper biasing for transistor 128 is provided by resistance 154 and RF choke coil 156 with capacitance 158 providing bypass path to ground for decoupling.

One side of crystal unit 160 is connected through coupling capacitor 162 to the emitter of transistor 128. The other side of crystal unit 160 faces the input impedance of the negative resistance generator being specifically connected to the emitter of transistor 164. Biasing is provided from DC supply 138 to the emitter of transistor 164 through resistance 166 and RF choke coil 168.

The negative resistance generator which loads crystal unit 160 includes the transistor 164 having emitter, base and collector terminals. Connected to the collector terminal of transistor 164 is the impedance $Z_1$ comprised of resistance 170 and inductance 172. Connected serially across the base and collector terminals is impedance $Z_2$ comprised of resistance 174 and capacitance 176. Connected to the base terminal of transistor 164 is impedance $Z_3$ comprised of inductance 178, bypassed to ground by capacitance 182. Biasing resistances 184 and 180 are connected between DC supply 138 and the base of transistor 164 through inductance 178. Ferrite shielding beads 186, 188 and 190 are employed as shown to eliminate UHF parasitic oscillations.

Figure 8B:
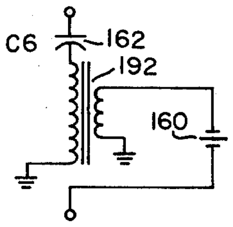

FIG. 8B shows an alternative arrangement for coupling the crystal unit 160 to the emitter of transistor 128. Interposed between coupling capacitance 162 and the crystal unit 160 is a matching transformer 192 which can be used for scaling impedances dependent upon the particular series resistance value of the crystal 160 and the impedance of transistor 128 facing crystal 160.

In one illustrative embodiment of this invention, the crystal unit 160 employs a fifth overtone quartz crystal unit having a 50 ohms series resistance and an unloaded Q of $2.9 \times 10^5$. Ideally and consistent with the above discussion of the negative resistance generator of FIGS. 7A and 7B, the value at inductances 172 and 178 and resistance 174 should be equal to 40 ohms $$(X_{L1} = X_3 = R_2 = 40 \text{ ohms}).$$

However, due to the insertion of resistance 170 to suppress parasitic high frequency oscillation at several hundred MHz in the transistor 112 and also due to finite transconductance (gm) which make the positive resistance terms in equation (4) non-negligible, the value of $R_2$ resistance 174 was chosen to be 30 ohms. In this embodiment of the Q-multiplied quartz resonator the frequency response and group delay were much improved and the Q of the loaded crystal unit 160 was increased to a value of $1 \times 10^6$, a better than 3 fold improvement.

Figure 9:
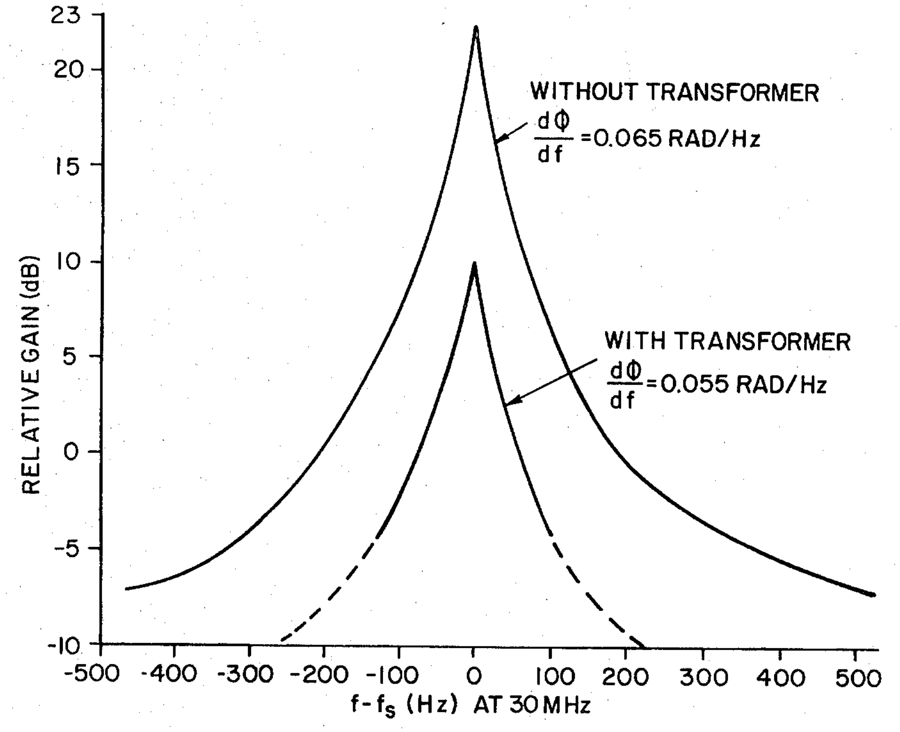
FIG. 9 is a graph showing the amplitude response for the 30-MHz Q-multiplied crystal resonator of FIG. 8A.

In FIG. 9 the measured amplitude response of a 30 MHz Q-multiplied crystal resonator configured as in FIGS. 8A and 8B is shown. The amplitude response is shown for the resonator without transformer coupling (FIG. 8A) and with transformer coupling (FIG. 8B). The improved group delay is reflected by the increased value of $d\theta/df$ measured at 30 MHz. Since as a good approximation for a single pole bandpass filter the following relationship governs:

$$2Q/f_0 = d\theta/df \text{ rad per Hz,} \tag{5}$$

it therefore is clear that for $d\theta/df = 0.065$ rad per Hz, the value of Q has been increased to $1 \times 10^6$.

Figure 10:
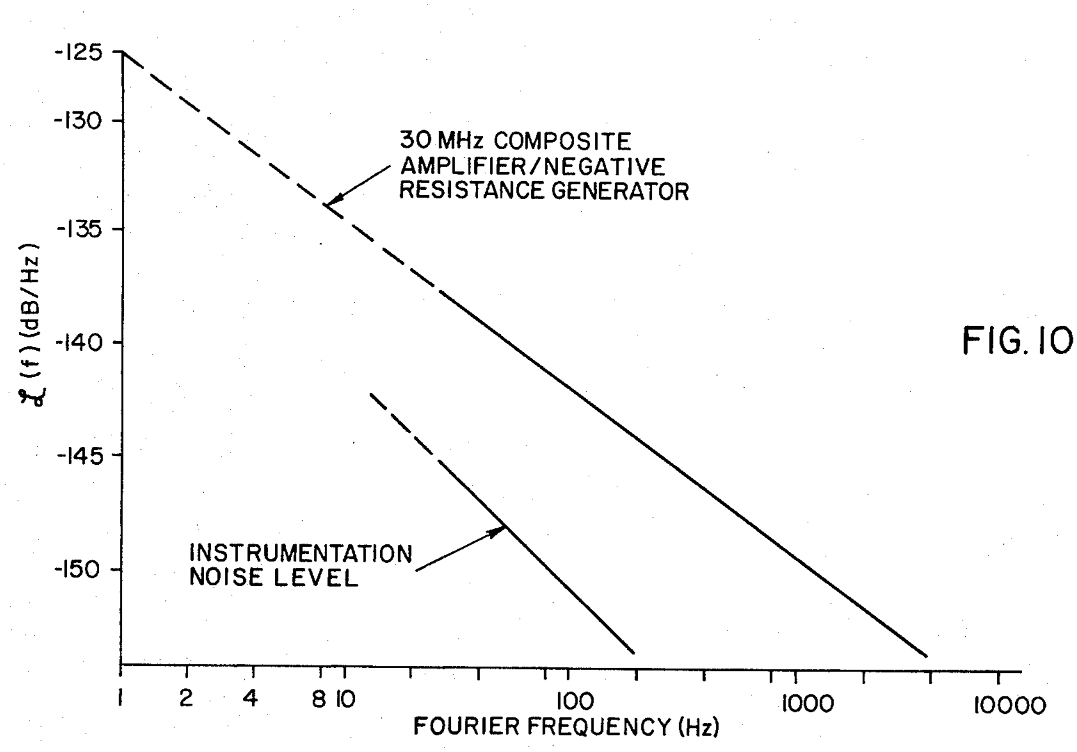
FIG. 10 shows the measured results for the spectral density L(*f*) of an 80-MHz Q-multiplied quartz crystal resonator of the present invention.

One of the most important requirements for the circuit of FIG. 3 is that the PM noise sideband level be exceptably low. Measurement of cascode amplifier/negative resistance generator phase noise was made by substituting a fixed resistor in place of the crystal unit 68 (the effective series resistance of the crystal being the same value as that of the fixed resistor) and then measuring the frequency components of the output of phase detector 78 with the feedback loop disconnected. The results are plotted in FIG. 10. The results are significant in that they demonstrate that the phase noise level associated with the negative resistance generator is quite comparable with that measured for nonregenerative type transistor amplifier circuitry and does not place a limitation on the performance of the resonator. Instrumentation noise level is also shown for a fuller understanding of this measurement.

Further reduction of the spectral density of phase fluctations at low Fourier frequency may be obtained through the use of impedance transformer 192 as shown in FIG. 8B. Resonator frequency response using a broadband transformer 192 for a 4:1 increase in effective resonator resistance is shown in FIG. 9. This result is obtained with a larger degree of local RF negative feedback due to the larger value of effective Q-multiplied crystal unit series resistance presented to transistor 128 (FIG. 8A).

Numerous changes may be made in the above described apparatus in the different embodiments of the invention particularly with reference to the exemplary parameters given without departing from the spirit thereof; therefore, it is intended that all matter contained in the foregoing description and in the accompanying drawings shall be interpreted as illustrative and not in a limiting sense.

I claim:

1. A Q-multiplied crystal resonator circuit for improved frequency signal generator stabilization having RF input and output means comprising:

a. first and second amplifier means, each having a plurality of terminals, said first and second amplifier means being in series connected configuration such that a first terminal of said second amplifier means is coupled to a first terminal of said first amplifier means, said first amplifier being adapted to receive an RF signal from said input means, said second amplifier being adapted to translate an RF signal to said output means;

b. a resonant circuit including a crystal unit coupled to a second terminal of said first amplifier means, and c. active means coupled to said resonant circuit for providing positive feedback to said crystal unit thereby increasing the effective Q of said crystal unit.

2. A Q-multiplied crystal resonator circuit as set forth in claim 1 wherein said active means is a negative resistance generator.

3. A Q-multiplied crystal resonator circuit as set forth in claim 2 wherein said negative resistance generator includes amplifier means having first, second and third terminals and first, second and third impedances connected across said first and second terminals of said amplifier means in a $\pi$ network said third terminal being coupled to said resonant circuit thereby presenting a negative resistance to said crystal unit.

4. Q-multiplied crystal resonator circuit as set forth in claim 1 wherein said first and second amplifier means are cascode connected semiconductor devices.

5. A Q-multiplied crystal resonator circuit as set forth in claim 1 wherein said resonant circuit further includes circuit means to neutralize the static capacitance of said crystal unit.

6. A Q-multiplied crystal resonator circuit for improved frequency stability having RF input and output means comprising:

a. a resonant circuit including a crystal unit, b. amplifier means having high gain and isolation characteristics coupled to said crystal unit for amplifying an RF signal with high output power to crystal dissipation ratio, said amplifier means being adapted to receive an RF signal from said input means and said amplifier means being adapted to translate an RF signal to said output means; and c. active negative resistance generator means coupled to said resonant circuit for providing positive feedback to said crystal unit thereby increasing the Q of said resonant circuit for improved frequency selectivity and suppression of amplifier means noise.

* * * * *